United States Patent [19]

Nagumo

[11] Patent Number: 4,821,072
[45] Date of Patent: Apr. 11, 1989

[54] PRESSURIZING-TYPE IMAGE FORMING DEVICE

[75] Inventor: Akihiko Nagumo, Kanagawa, Japan

[73] Assignee: Fuji Photo Film Co., Ltd., Kanagawa, Japan

[21] Appl. No.: 108,857

[22] Filed: Sep. 9, 1987

[30] Foreign Application Priority Data

Sep. 11, 1986 [JP] Japan .................. 61-214792

[51] Int. Cl.$^4$ .................. G03B 27/32; G03B 27/52
[52] U.S. Cl. .................. 355/27; 354/297; 354/304; 430/138
[58] Field of Search .................. 355/27, 28; 354/291, 354/304; 430/138

[56] References Cited

U.S. PATENT DOCUMENTS

| | | | |
|---|---|---|---|
| 4,448,516 | 5/1984 | Arney et al. | 355/27 |
| 4,624,560 | 11/1986 | Beery | 355/27 |
| 4,648,699 | 3/1987 | Holycross et al. | 355/27 X |
| 4,714,943 | 12/1987 | Sakakibara et al. | 355/27 |
| 4,727,392 | 2/1988 | Stone et al. | 355/27 X |

Primary Examiner—Richard A. Wintercorn
Attorney, Agent, or Firm—Sughrue, Mion, Zinn, Macpeak and Seas

[57] ABSTRACT

A pressurizing-type image forming device comprises a platen roller and a projection roller which is axially parallel to the axis of the platen roller, and the projection roller having a plurality of projections which extend widthwise on the surface thereof, and which projection roller is positioned at a location where only the projections are brought into contact with the platen roller, the circumferential speed $V_2$ at the surface of the projections on the projection roller being set higher than circumferential speed $V_1$ at the surface of the platen roller, and the photosensitive member which is fed by way of the platen roller being struck by the projections.

10 Claims, 2 Drawing Sheets

FIG.2
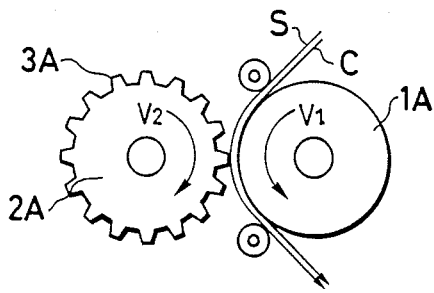
FIG.3  FIG.4
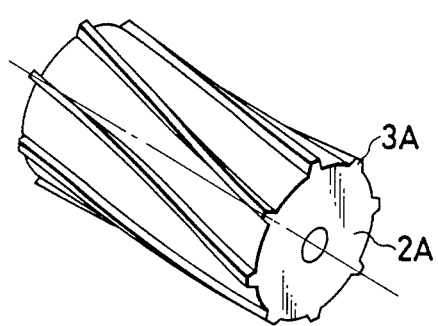 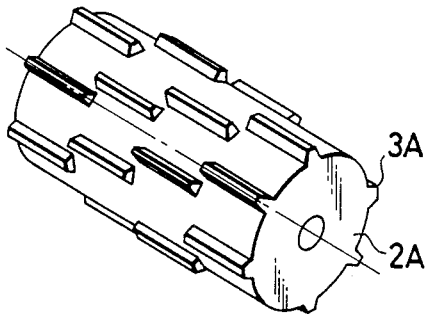
FIG.5A  FIG.5C
 FIG.5B   FIG.5D
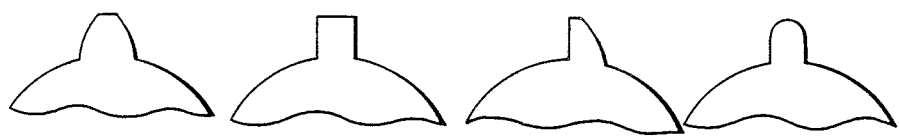

PRESSURIZING-TYPE IMAGE FORMING DEVICE

BACKGROUND OF THE INVENTION
FIELD OF THE INVENTION

This invention relates to a pressurizing-type image forming device in which a material which acts to fix an image produced in an image exposure manner by way of pressure is applied to a carrier to form a photosensitive member, or a substance having sensitivity which acts to fix an image obtained by way of pressure is applied to a carrier body to form a photosensitive and pressure sensitive member on which the image is obtained by exposure, and the obtained image is fixed by way of pressure.

An image recording material which uses a microcapsule accommodating a photosensitive composition has been proposed, for example, in Japanese Patent Public Disclosure No. 179836/1982, which is a known system for holding a synthetic polymeric walled capsule containing a vinyl compound, a photochemical polymerization initiator and a colorant precursor on a carrier thereof. The image recording method which uses this system is a system in which some of the microcapsules are hardened in a desired shape according to the image generated by exposure, and the unhardened microcapsules are burst by pressure so as to obtain a color image from the delivered colorant precursor. This system is characterized by its capability of obtaining an image of high quality by way of a dry and simple treatment. This system is, however, remarkably inferior in photosensitivity compared to the kind of system which uses a silver halogenide.

A novel recording material which can overcome the aforesaid problem and which displays high sensitivity was proposed in Japanese Patent Publication No. 117089/1985 by the applicant of this invention, whereby an image of high quality can be attained by way of a simple dry treatment. This recording material is made from a photosensitive composition in which at least a photosensitive silver halogenide, a reducer, a polymerizable compound and a color image forming material are applied to a carrier, and at least the polymerizable compound and the color image forming material are enclosed in one microcapsule.

The image recording method which records an image with the use of this photosensitive material was proposed by the applicant of this invention in the specification of Japanese Patent Publication No. 121284/1985. This method of recording an image is as follows: first a latent image is formed by way of exposing the material to an image, then the image is developed by heating, and the polymerizable compound in the portion where the latent image is present is polymerized so as to produce a high-molecular compound for the purpose of hardening the microcapsules; then, the material is laminated with an image receiving material having an image receiving layer to which a color image forming material can be transferred by pressurization, and at least a part of the microcapsules in the portion in which no latent image is present are burst for the purpose of transferring the color image forming material to the image receiving material, whereby an image is obtained on the image receiving material. In order to form a clear image when an image obtained by heat developing after exposing the material to an image on the photosensitive member is fixed on an image receiving layer, equal pressure needs to be applied under certain conditions.

In the conventional roller pressurizing method, it is difficult to apply pressure equally in the widthwise direction, and in the case of the impact pressure method in which a small sized head hits a sheet, the time required to hit the entire surface is too long.

OBJECT OF THE INVENTION

It is therefore an object of the present invention to provide a pressurizing-type image forming device which can overcome the above problems, in which the material is exposed to an image to form a reproduction of the image on a photosensitive member in which a material which acts to fix the image produced by exposure when subjected to pressure is applied to a carrier, and the reproduced image is securely fixed onto an image receiving layer, whereby a clear image can be obtained. Further, the device is capable of pressurization in an equal manner in the widthwise direction and a rapid manner in overall width and overall length, as well as being of compact size with simple structure.

SUMMARY OF THE INVENTION

The pressurizing-type image forming device according to the present invention achieves the aforesaid object by adopting a structure which is characterized in that an image is obtained by way of exposure of a photosensitive member having a carrier to which is applied a material capable of fixing the image produced by way of exposure, and the obtained image is fixed by the application of pressure, the pressurizing-type image forming device comprising a platen roller and a projection roller which is axially parallel to the axis of the platen roller, and the projection roller having a plurality of projections which extend widthwise on the surface thereof, and which projection roller is positioned at a location where only the projections are brought into contact with the platen roller, the circumferential speed $V_2$ at the surface of the projections on the projection roller being set higher than the circumferential speed $V_1$ at the surface of the platen roller, and the photosensitive member which is fed by the platen roller being struck by the projections.

According to the present invention, pressurization can be realized equally in the widthwise direction, and at high speed over the entire width and length, and, furthermore, the device can be compact in size and light in weight.

The "photosensitive member" in this invention means a material for obtaining a visible image by application of pressure to a latent image produced by exposure.

In this case, provision of a manufacturing process such as heat developing as pre-treatment before application of pressure or wet developing may be employed.

A material of the type in which a polymerizable compound is hardened in correspondence with the image by way of exposing of the material to the image, and to which pressure is applied to obtain a visible image, was proposed by the applicant of the present invention in Japanese Patent Public Disclosure No. 179836/1982. This material comprises a synthetic high polymer resin walled capsule containing a vinyl compound, a photopolymerization initiator and a colorant precursor which is held on a carrier.

Also proposed by the applicant of the present invention in Japanese Patent Publication Nos. 121284/1985 and 53811/1986 is the type of material in which a silver halogenide is contained and heat developing is carried out after the material has been exposed to the image so as to heat develop the silver halogenide, a polymerizable compound being hardened simultaneously and in accordance with this development, and pressure being applied so as to obtain a visible image. The material proposed in Japanese Patent Publication No. 121284/1985 is one wherein a color image forming material is transferred onto an image receiving material having an image receiving layer after heat development has been completed so as to obtain an image on the image receiving material. It is characterized in that at least a photosensitive silver halogenide, a reducer, a polymerizable compound and a color image forming material are applied to a carrier, and at least the polymerizable compound and the color image forming material are enclosed in the same microcapsule. Further, the material proposed in Japanese Patent Publication No. 53811/1986 is characterized in that an image is obtained on a photosensitive member without any use of an image receiving material, and a silver halogenide, a reducer, a polymerizable compound and two materials which develop color at the time of being brought into contact are contained. One of the two materials which develop color and the polymerizable compound are enclosed in a microcapsule, and the other material which develops color has a photosensitive layer on the carrier thereof which is present outside of the microcapsule accommodating the polymerizable coumpound.

The above and other objects and features of the present invention will become apparent from the following description of preferred embodiments making reference to the accompanying drawings.

BRIEF DESCRIPTION OF THE DRAWINGS

FIG. 2 is a schematic side view illustrating an embodiment of the pressure image forming device according to the present invention;

FIGS. 3 and 4 are inclined views illustrating examples of rollers having projections; and FIGS. 5A to 5D show outlines of various lateral cross sectional shapes of the projections.

DESCRIPTION OF THE PREFERRED EMBODIMENTS

Figure 1:
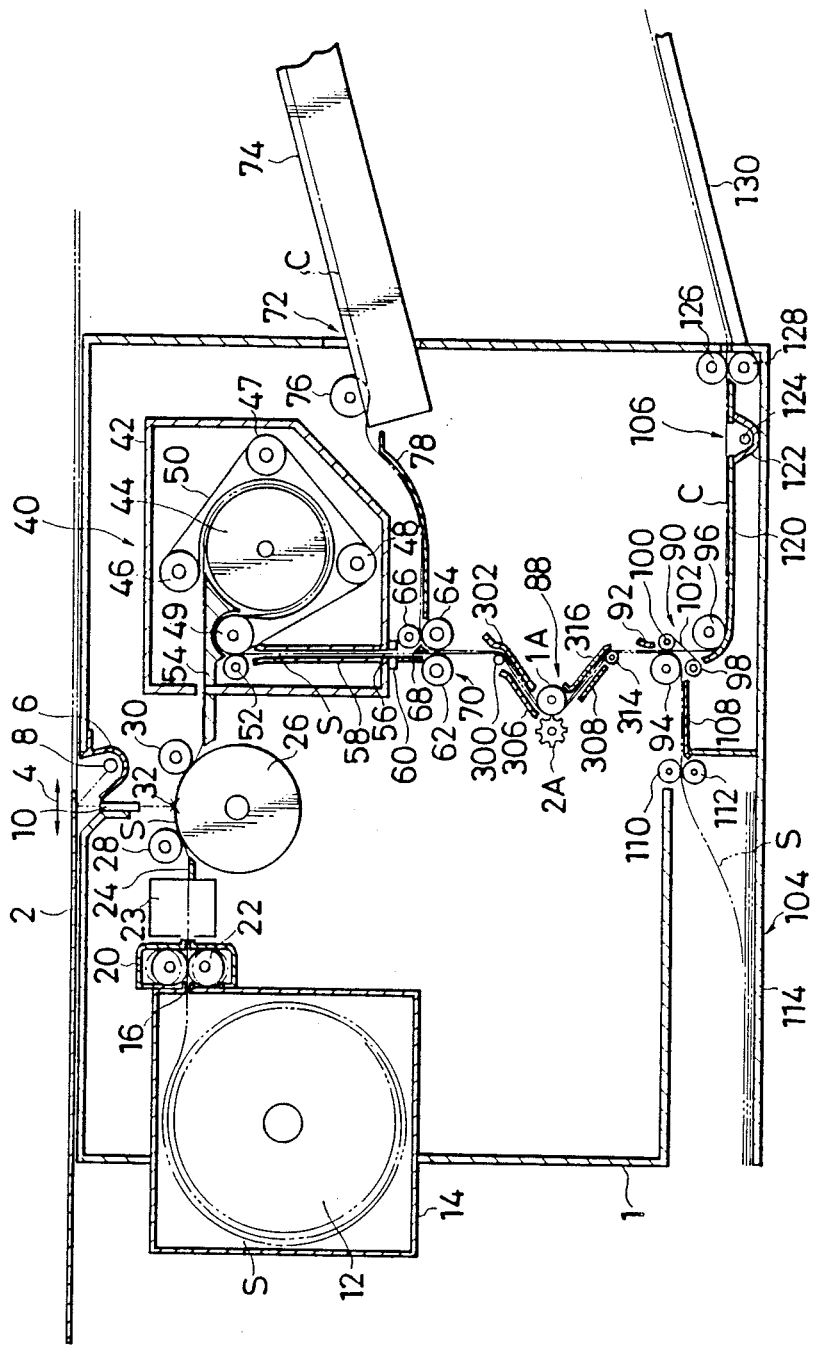
FIG. 1 is a view illustrating a structure of an image recording device including a pressure image forming device according to the present invention.

Referring to the accompanying drawings, the embodiments of the present invention will now be described.

FIG. 1 is a cross sectional view illustrating an image recording device which includes a pressurizing-type image forming device according to the present invention. This image recording device uses a photosensitive member of a type in which an image is formed on a member for receiving an image. An original supporting glass plate 2 is, as shown in FIG. 1, secured in such a manner as to be reciprocatingly movable on the top surface of a housing 1 in the direction designated by an arrow 4.

That is, the glass plate 2 with the original mounted thereon facing downward is adapted to move between the position shown by the continuous lines and the position shown by the dotted lines, as illustrated.

An irradiating lamp 8 equipped with a reflection mirror 6 is provided beneath the glass plate 2 for the purpose of illuminating the original, while a fiber lens array 10 is also provided for the purpose of forming an image of the original on a photosensitive member S which is located at a predetermined position.

A photosensitive member cartridge 14 which accommodates a photosensitive member roller 12 on which the photosensitive member S is wound is detachably secured to the side portion of the housing 1. A pair of photosensitive member delivery rollers 22 and 22 which is accommodated in a magazine connecting black box 20 is arranged at an exit 16 for the photosensitive member S in the photosensitive member cartridge 14 for the purpose of delivering a predetermined length of the photosensitive member S wound around the photosensitive member roller 12 at the desired time. The photosensitive member delivery rollers 22 and 22 are adapted to move in such a manner that they separate from each other as shown by the phantom lines when the tip of the photosensitive member S reaches that point to facilitate the feeding of the photosensitive member S. A cutter unit 23 for cutting the photosensitive member S and a guide plate 24 are arranged in front of (here and hereinafter the term "in front" means the downstream side in the direction of feeding of the photosensitive member S) the magazine connecting black box 20.

An exposed photosensitive member supporting roller 26 and two photosensitive member nip rollers 28 and 30 which are brought into contact with the former are arranged in front of the guide plate 24. The photosensitive member S guided by the guide plate 24 is brought into close contact with a exposed photosensitive member supporting roller 26 by means of two photosensitive member nip rollers 28 and 30, and the photosensitive material to be exposed to the original is then exposed for the purpose of transferring the image at a position 32 between the photosensitive member nip rollers 28 and 30 by means of the fiber lens array 10.

A heat developing device 40 for developing the exposed photosensitive member S by way of heating is positioned in front of the exposed photosensitive member supporting roller 26. The heat developing device 40 comprises a developing housing 42 having an adiabatic function, a heating roller 44 accommodated in the developing housing 42 which is heated up to approximately 120° C., an endless belt 50 which is supported by four belt supporting rollers 46, 47, 48 and 49 and which is wound around approximately 270° of the outer peripheral chord of the heating roller 44, and a nip roller 52 which is pressed so as to be brought into contact with the supporting roller 49.

The heat developing device 40 further comprises a guide device 54 which is adapted to guide the photosensitive member S which has been fed from the exposed photosensitive member supporting roller 26 onto the heating roller 44 and also to separate the photosensitive member S from the heating roller 44 after heat developing has been completed, and a vertical guide device 58 which is adapted to guide the developed photosensitive member S which has been fed by the supporting roller 49 and the nip roller 52 toward the exit 56. A photosensitive tip detecting sensor 60 is provided at the exit 56.

A photosensitive member and image receiving paper laminating device 70 is positioned just beneath the exit 56, comprising a pair of pressure rollers 62 and 64, a nip roller 66 which is pressed by the pressure roller 64, and a guide member 68 adapted to guide the photosensitive member S toward the portion at which the pressure rollers 62 and 64 are brought into contact with each other.

An image receiving paper supplying device 72 is positioned at the side portion of the photosensitive member and image receiving paper laminating device 70. The image receiving paper supplying device 72 comprises an image receiving paper supplying cassette 74 which is positioned so as to project from and be detachably secured to the housing 1, an image receiving paper delivery roller 76 for delivering an image receiving paper C accommodated in the cassette 74, and a guide plate 78 for guiding the image receiving paper C which has been delivered by the delivery roller 76 toward the position at which the pressure roller 64 and the nip roller 66 are brought into contact with each other. The width of the image receiving paper C is smaller by 6 mm than that of the photosensitive member S, and the image receiving paper C is laminated in such a manner that the paper is in alignment with the center of the photosensitive member S in the widthwise direction when they are in the photosensitive member and image receiving paper laminating device 70.

A pressure image forming device 88 for transforming the image by way of pressurizing the laminated photosensitive member S and the image receiving paper C (to be described as "sheet W" hereinafter) is positioned beneath the photosensitive member and image receiving paper laminating device 70.

The pressure image forming device according to the present invention is, as shown in FIGS. 1 and 2, a device that utilizes a photosensitive, pressure sensitive heat developing material in which the photosensitive material which can be developed by way of heat and on which the obtained image can be fixed using pressure is applied to a carrier. This pressurizing-type image forming device fixes the image to which the photosensitive material has been exposed and then developed by way of heating. The characteristics of the device will now be described. The device comprises a platen roller 1A and a projection roller 2A having a plurality of projections 3A which are arranged in the widthwise direction, the axis of the projection roller being parallel to that of the aforesaid platen roller. The projection roller 2A is positioned at a location where only the projections 3A thereof are brought into contact with the platen roller 1A. The circumferential speed $V_2$ at the surface of the projections 3A of the projection roller 2A is arranged higher than the circumferential speed $V_1$ at the surface of the platen roller 1A, and the sheet which is transported by way of the platen roller is struck by the projections 3A for the purpose of applying pressure thereto.

The reason why the circumferential speed $V_2$ of the projections 3A is arranged to be higher than the circumferential speed $V_1$ of the platen roller 1A is to prevent the discontinuous pressurizing of the sheet in the forward direction. That is, the entire surface of the sheet needs to be pressurized in the forward direction (of course, in the widthwise direction too). The sheet is, however, pressurized discontinuously in the forward direction if $V_2 = V_1$. It is therefore, necessary for the relationship to be $V_2 > V_1$. In the case where $V_2/V_1 < 2$, there is a risk that complete pressurization will be impossible. On the other hand, in the case where $V_2/V_1 > 20$, the shearing force applied to the sheet becomes large, which causes a double-sheet to experience slippage and causes a single-sheet to be damaged. The preferable value of $V_2/V_1$ is in the range between 2:1 and 20:1, and the value $V_2/V_1$ is preferably as small as possible provided that pressurization of the entire surface can be realized. Although the direction of rotation of the projection roller 2A is illustrated in FIG. 2 to be opposite to that of the platen roller 1A, an arrangement in which this direction is the same may also be adopted.

Further, the projections 3A may be provided parallel to the axis of the projection roller 2A, although they are preferably arranged at an angle to the generatrix on the surface of the platen roller with regard to a development of the platen roller, the generatrix being arranged parallel to the axis of the projection roller. The reason for this is as follows: if the projections are arranged without being disposed at an angle, a large impact force is applied to the sheet because the full width of the sheet must be simultaneously nipped at the time of introducing it into the portion between the rollers or where it is delivered therefrom. The degree of this angle of disposition of the projections is preferably less than five degrees, more preferably between 0.5 degrees and two degrees. The angle may either be arranged in the righthand direction or the lefthand direction.

Furthermore, it is preferable to arrange a plurality of groups of projections 3A in the widthwise direction by adopting an arrangement in which the projections 3A each having a narrow width relative to the width of the projection roller 2A are equally spaced in the circumferential direction, and in which the projections 3A which are adjacent to each other in the widthwise direction are disposed in an eccentric manner in the circumferential direction. The reason for this is as follows: if the width of the projections 3A covers the overall width of the platen roller 2A, the roller deflects at the moment the sheet is nipped, and pressure at the center is insufficient; in order to prevent this deflection, however, any increase in the diameter of the roller provided for the purpose of increasing in rigidity causes the overall weight to increase. Arrangement of the partial projections contributes achieving a decrease in the amount of deflection, as a result of which the overall size of the device can be reduced.

The lateral cross sectional shape of the projections 3A can be selected optionally from an involute shape (See FIG. 5A), a square shape (See FIG. 5B), a saw tooth shape (See FIG. 5C), and a rounded top shape (See FIG. 5D). A type of rounded shape is preferable as this prevents the sheet from being hit by a short shoulder portion.

A photosensitive member and image receiving paper separating device 90 is provided beneath the pressurizing-type image forming device 88. The photosensitive member and image receiving paper separating device 90 comprises a guide member 92, a first feeding roller 94, a second feeding roller 96 and a separating belt 102 which is arranged between the guide rollers 98 and 100 so as to be brought into contact only with the photosensitive member S at both outer ends of the first feeding roller 94.

A photosensitive member disposal portion 104 is provided at the side portion of the separating device 90, and a fixing device 106 is provided on the other side. The photosensitive member disposal portion 104 comprises a guide member 108, a pair of feeding rollers 110 and 112 and a disposal box 114, and acts to introduce the photosensitive member S fed from the separating device 90 into the disposal box 114 by means of the feeding rollers 110 and 112.

The fixing device 106 comprises a guide member 120, an ultraviolet ray lamp 124 equipped with a reflecting member 122 and a pair of feeding rollers 126 and 128.

The device acts to fix the image on the image receiving paper C which has been fed from the separating device 90 and guided by the guide member 120 by irradiating the same with ultraviolet rays for approximately five seconds.

An output tray 130 which serves to receive the image receiving paper C is provided in front of the fixing device 106 so as to project from the housing 1.

The aforesaid image recording device is further provided with the illumination lamp 8, the cutter unit 23, the original supporting glass plate 2, the photosensitive member tip detecting sensor 60, and a control unit (omitted from illustration) which is connected to the photosensitive member and image receiving paper laminating device 70. The operation of said image recording device will now be described.

The tip of the photosensitive member S is arranged to be positioned near the cutting portion of the cutter unit 23 or in the magazine connecting black box 20 at the time of preparing for an operation of the image recording device, that is, at the time of preparation for copying. The photosensitive member delivery roller 22 is then actuated by pressing a copy start button (omitted from illustration) so as to feed the photosensitive member S. The illumination lamp 8 is lit up just before the tip of the member reaches a predetermined position 32 on the exposed photosensitive member supporting roller 26 so as to light the original. When the tip reaches that position 32, the original supporting glass plate 2 moves, and the photosensitive member S is fed in accordance with this movement, and the image of the original is projected onto this photosensitive member S for exposure. When the photosensitive member S has been fed by a distance which is substantially equivalent to the distance of movement of the original, and in the same direction, the cutter unit is actuated so as to cut the photosensitive member S. The photosensitive member S which has been exposed and cut is then fed to the heat developing device 40 and is pressed onto the heating roller 44 by means of the endless belt 50 so as to be heated at approximately 120° C. for the purpose of development. The photosensitive member tip detecting sensor 60 detects the fact that the tip of the photosensitive member S which has been developed passes the exit 56.

Meanwhile, in the image receiving paper supplying device 72, the image receiving paper C is fed in synchronization with the pushing of the copy start button or with the exposure start timing. When the tip is fed to the position at which it is nipped by means of the pressure roller 64 and the nip roller 66, the image receiving paper C stops.

In the photosensitive member and image receiving paper laminating device 70, the image receiving paper C of small width is positioned at the center in the widthwise direction of the photosensitive member S of large width. Further, they are laminated in such a way that the tip of the photosensitive member S is aligned with the tip of the image receiving paper C, or so that the former is forward of the latter by several millimeters. The laminated member is then fed to the pressurizing-type image forming device 88 for the purpose of, as described hereinbefore, pressurizing it at a pressure of approximately 200kg/cm$^2$, as a result of which the image is transferred onto the image receiving paper.

The transformed photosensitive member S is separated from the image receiving paper C by means of the separating belt 102 of the separating device 90, then is fed to the photosensitive member disposal portion 104. Meanwhile, the image receiving paper C is fed to the fixing device 106 for application of ultraviolet rays for approximately five seconds for the purpose of fixing the image, then is fed to the output tray 130 by means of the feeding rollers 126 and 128.

The aforesaid illuminating lamp 8 may be of a type which irradiates radioactive rays including visible radiation, specifically, a stroboscope, flash, tungsten lamp, mercury lamp, halogen lamp such as an iodo lamp, xenon lamp, laser beam, CRT light source, plasma light source, fluorescent tube, or light-emitting diode can be employed as a light source. Further, the structure may be formed by combining a microshutter array which uses a LCD (liquid crystal display) or PLZT (zirconium titanate doping lanthanum) and a linear light source or planar light source.

The exposure of the photosensitive material S is realized by directly forming the original image on the photosensitive member S by means of the fiber lens array 10. A spherical lens may, however, be employed as an alternative to the fiber lens array 10. Furthermore, exposure of the photosensitive member S may be indirectly realized by means of an image electrical signal by combining a CRT, FOT (fiber optic tube), LCA (liquid crystal array), electric optic element array or laser and a modulator and a scanner, or combining an LED (light-emitting diode) and a scanner and so on. If using one of the aforesaid combinations, gradiation correction, color correction, variable power and treatments for editing can be applied to the image signal.

Although both the original and the photosensitive member are moved and the optical system is fixed for the purpose of scanning the original in the aforesaid image recording device, a method in which either the original or the photosensitive member and the optical system are moved may also be employed.

Furthermore, belt heating, thermal head heating in which heating bodies are arranged in the form of a line, heating by conduction of electricity, or irradiation with microwave or infrared rays can be employed to form the heat developing device 40 of the aforesaid image recording device as an alternative to the method in which the heat developing device 40 performs heating by means of the heating roller 44. Some types of photosensitive member S can be heated with the use of an eddy current generated by way of electromagnetic induction. A gas which is inert with respect to the photosensitive member S such as a fluorine liquid may be heated in a heated bath. The heating temperature in the aforementioned cases is usually in the range of 80° C. to 200° C., preferably 100° C. to 160° C.

Although the developing member S is laminated with the image receiving paper C for the purpose of pressure transforming in the aforesaid image recording device after the image has been developed, this invention is preferably applied to an image recording device in which the developing member S is laminated with the image receiving paper, then developing treatment and the pressure transforming is then carried out. Furthermore, the embodiment exemplified is one in which the photosensitive and pressure sensitive heat developing member is of the type in which an image is pressurized and transferred onto an image receiving layer which is provided on the image receiving material. However, in the case of use of a photosensitive member having an image receiving layer, the image receiving material supplying device and the photosensitive member disposal tray are omitted from the image recording device.

The invention has thus been shown and described with reference to specific embodiments, however, it should be noted that the invention is in no way limited to the details of the illustrated structures but changes and modifications may be made without departing from the scope of the appended claims.

I claim:

1. A pressurizing-type image forming device wherein a photosensitive member having a material capable of fixing an image formed thereon by exposure to an original image and a carrier carrying said material is first exposed to said original image and then pressurized so that the image formed on said photosensitive member is fixed, said device comprising:
   a platen roller; and
   a projection roller with an axis parallel to the axis of said platen roller, having a plurality of projections which extend widthwise on the surface thereof, and which is positioned at a location where only said projections are brought into contact with said platen roller, the circumferential speed $V_2$ at the surface of said projections on said projection roller being set higher than the circumferential speed $V_1$ at the surface of said platen roller, whereby said photosensitive member which is being fed by way of said platen roller is struck by said projections.

2. A pressurizing-type image forming device according to claim 1, wherein said projections are provided in a parallel manner with respect to the axis of said projection roller.

3. A pressurizing-type image forming device according to claim 1, wherein said projections are provided in a slanted manner as viewed in a developed view of said platen roller with respect to a reference line on said platen roller surface which is parallel to the axis of said projection roller.

4. A pressurizing-type image forming device according to any one of claims 1, 2 or 3, wherein projections of a width smaller than that of said projection roller having projections are equally spaced in the circumferential direction, and said projections which are adjacent in the widthwise direction are positioned in an eccentric manner in the circumferential direction, whereby a plurality of groups of projections are provided.

5. A pressurizing-type image forming device according to claim 3, wherein the degree of inclination of said projections is arranged to be in the range between 0.5 degrees and five degrees.

6. A pressurizing-type image forming device according to any one of claims 1, 2 or 3, wherein said device is actuated by one power source through respective speed reduction devices for the purpose of attaining the proportion $V_2/V_1$ in the range between 2:1 and 20:1 in which $V_2$ is the circumferential speed at the surface of said projections of said projection roller having projections and $V_1$ is the circumferential speed at the surface of said platen roller.

7. A pressurizing-type image forming device according to any one of claims 1, 2 or 3, wherein the lateral cross sectional shape of said projections is designed in the form of an involute shape.

8. A pressurizing-type image forming device according to any one of claims 1, 2 or 3, wherein the lateral cross sectional shape of said projections is designed in the form of a square shape.

9. A pressurizing-type image forming device according to any one of claims 1, 2 or 3, wherein the lateral cross sectional shape of said projections is designed in a saw tooth form.

10. A pressurizing-type image forming device according to any one of claims, 2 or 3, wherein the lateral cross sectional shape of said projections is designed to have a rounded top shape.

* * * * *